Figure 1:
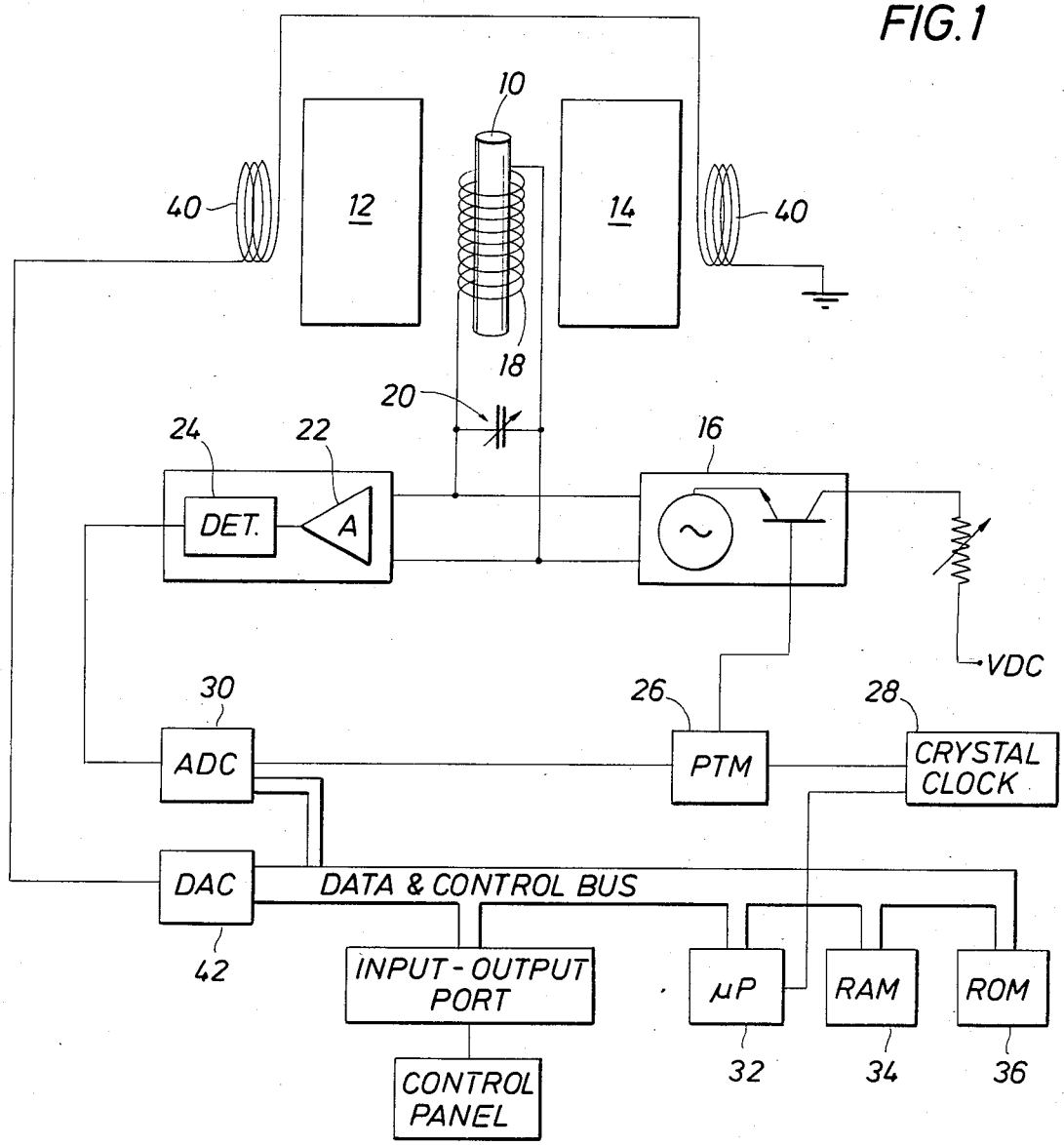

United States Patent [19]

Mee et al.

[11] Patent Number: 4,543,529

[45] Date of Patent: Sep. 24, 1985

[54] METHOD OF TUNING AN NMR APPARATUS

[75] Inventors: Gary L. Mee; M. Robert Willcott, both of Houston, Tex.

[73] Assignee: NMR Imaging, Inc., Houston, Tex.

[21] Appl. No.: 455,561

[22] Filed: Jan. 4, 1983

[51] Int. Cl.$^4$ .............................................. G01R 33/08
[52] U.S. Cl. ...................................... 324/313; 324/314
[58] Field of Search ............... 324/300, 307, 308, 310, 324/311, 312, 313, 314

[56] References Cited

U.S. PATENT DOCUMENTS

| 3,530,371 | 9/1970 | Nelson | 324/313 |
| 4,068,161 | 1/1978 | Ernst | 324/311 |
| 4,110,681 | 8/1978 | Hofer | 324/313 |

*Primary Examiner*—Michael J. Tokar

[57] ABSTRACT

A method of tuning an NMR spectrometer is disclosed that includes the step of locating a specimen in a stationary magnetic field, generating a 90° alternating magnetic field excitation pulse at the Larmor frequency of the selected nuclei of the specimen followed by one or more 180° alternating magnetic field refocusing pulses of preselected duration at fixed time intervals having the same phase relationships using a free-running oscillator that is turned off between pulses, measuring the primary echo train of a selected nuclear magnetic resonance signal, changing the strength of the stationary magnetic field to change the Larmor frequency of the selected nuclei, repeating the pulsing step and the measuring step until the maximum primary echo is obtained, and while holding the stationary field at that strength, measuring the desired nuclear magnetic resonance characteristic using the spin-echo method and the free-running oscillator to supply the pulses.

2 Claims, 2 Drawing Figures

U.S. Patent   Sep. 24, 1985   4,543,529

METHOD OF TUNING AN NMR APPARATUS

This invention relates to nuclear magnetic resonance apparatus generally and in particular to a method of tuning such apparatus to bring the alternating magnetic field into the proper frequency and phase relationship with the Larmor frequency and phase of a sufficient number of the selected nuclei of the sample that a meaningful echo-spin signal can be obtained.

The use of nuclear magnetic resonance as an investigative tool is well known. It is used to detect the presence of certain selected nuclei in a specimen. The nuclei must have at least one free proton or neutron in order to be detected in this manner. These nuclei have the property of non-zero spin and act like tiny magnets. When placed in a stationary magnetic field, the field exerts a force or, more specifically, a torque on the spinning nuclear magnets, causing them to precess. The frequency of precession can be tuned, i.e. increased or decreased by increasing or decreasing the strength of the external stationary field. The frequency of precession for certain nuclei in a given magnetic field can be calculated and is generally referred to as the Larmor frequency.

In magnetic resonance devices, an oscillating magnetic field is superimposed on the specimen in a plane perpendicular to the direction of the stationary magnetic field. When the frequency of the oscillating field is different from the Larmor frequency of the nuclear magnets, the two magnets will be out of phase, or not synchronized. The nuclear magnet will be successively attracted and repulsed by the superimposed oscillating field during a complete revolution with the result that the nuclear magnet will wobble only slightly. When they are synchronized, however, there will be a steady force acting on the nuclear magnet. Thus, in magnetic resonance, when the frequency of the superimposed magnetic field is equal to the Larmor frequency, the orientation angle will change suddenly and the nucleus will be raised or lowered to another energy state. When a spin system is raised to a higher stage, energy is extracted from the superimposed field and vice versa.

Most NMR experiments are presently performed by applying a radio frequency pulse to the system and observing a free induction decay (FID). The Fourier transform of the free induction decay results in a frequency display or spectrum. The chemical and physical information content of the spectrum is coded as intensity, a static property, and line width and saturation, both dynamic properties. The latter two quantities are results of the relaxation processes symbolized as $T_2$ and $T_1$ respectively. Both of these relaxation times are intrinsic properties of the selected nuclei in the specimen under study.

If the stationary magnetic field is uniform the phase coherent vector, $M_y$, will decay with respect to time along the curve $e^{-t/T_2}$. Unfortunately, the stationary magnetic fields available at the present time from either a permanent magnet or an electro-magnet are far from uniform. Consequently, a large percentage of the nuclei will be precessing at different Larmor frequencies due to gradients in the magnetic field. This results in a much more rapid loss of the phase coherent vector, $M_y$.

It has long been known that some of the lost signal due to magnetic field gradients can be recovered by the use of spin-echo techniques. See Hann, E. L., "Spin Echoes", Physical Review, Vol. 80, No. 4 (Nov. 15, 1948). In a typical spin-echo experiment, the initial excitation is provided by a 90° excitation pulse followed by one or more 180° refocusing pulses. The refocusing pulses are applied at fixed time intervals, usually twice the time delay between the 90° and first 180° pulse. Problems arise in the spin-echo experiment, however, if attention is not paid to the phase and accuracy of the 180° refocusing pulses. Errors that seem small in the formation of one echo will accumulate, and obscure the meaning of the echo train. The subject is well known to one practiced in the art as the Carr-Purcell spin-echo sequence, the Meiboom-Gill modification of the Carr-Purcell sequence, and the Haberlein modification of the Meiboom-Gill modification of the Carr-Purcell sequence. In all of these modifications, control of the phase of the excitation is important, and is accomplished by phase shift networks in the transmitter and receiver networks. All such phase referenced experiments require a master clock capable of shifting the phase of alternating field in increments of at least as small as 90°.

As stated above, in the past all attempts to match the phase of the frequency of precession with the phase of the superimposed alternating magnetic field was to adjust the phase of the superimposed field to that of the precessing nuclei. This required expensive and complicated circuits and was time consuming.

Therefore it is an object and feature of this invention to provide a method for tuning an NMR machine to match the frequency and the phase of the precession of the nuclei with the phase of the superimposed alternating magnetic field by repeatedly changing the frequency of the rotating nuclei and measuring $T_2$ using the spin-echo technique for each change until the maximum primary echo is obtained at which time the machine is tuned sufficiently to produce very accurate measurements of $T_1$ and $T_2$.

These and other objects, advantages, and features of this invention will be apparent to those skilled in the art from a consideration of this specification including the attached drawings and appended claims.

Figure 2:
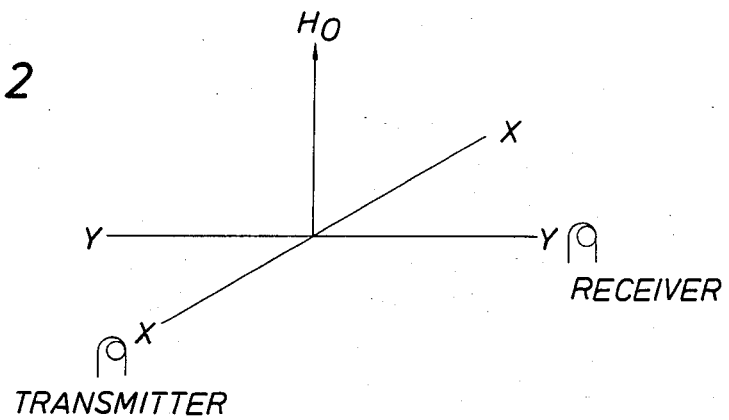

FIG. 1 is a schematic diagram of an NMR machine with a block diagram of the control and circuitry employed in the practice of the method of this invention; and FIG. 2 is a schematic diagram of the relative positions of the stationary magnetic field Ho, shown as acting along the z axis, and the RF transmitter and receiver positioned along the x and y axes, respectively.

In FIG. 1, sample tube 10 is located in the air gap between poles 12 and 14 of a permanent magnet or an electro-magnet. Oscillator or transmitter 16 provides an RF signal to coil 18 having approximately the Larmor frequency of the nuclei in the sample whose $T_1$ and $T_2$ is to be measured. The frequency of the RF signal can be adjusted with tuning capacitor 20.

As shown in the drawing, amplifier 22 and detector 24 are connected to the same coil 18 as oscillator 16. Actually, the detector will have its own coil and generally this coil is positioned orthogonally with respect to the transmitter coil. For example, the transmitter coil may transmit along the x-axis while the receiver is positioned along the y-axis, as shown in FIG. 2. Oscillator 16 is a free-running oscillator for reasons that will be discussed more fully below. It is controlled by programmable time module (PTM) 26. Clock 28 provides a stable time base to the PTM which in turn controls the time oscillator 16 is on and the length of time that it is off. The spin-echo signals received by detector 24 are transmitted through analog digital converter (ADC) 30 to PTM 26. Microprocesser 32 which includes RAM 34 and ROM 36, controls the operation of the PTM.

To operate the spectrometer in accordance with the method of this invention, microprocesser 32 which controls the overall operation will cause PTM 26 to turn transmitter or oscillator 16 on to provide a 90° pulse to the specimen. This will be followed by one or more 180° pulses. Detector 24 then will pick up the spin-echo signals, transfer them back to the PTM through analog digital converter 30. Microprocesser 32 will then change the DC current flowing to bucking coil 40 through digital analog converter (DAC) 42 to change slightly the precessing frequency of the nuclei. This procedure will then be repeated with each primary spin-echo being compared to the others obtained until a maximum primary echo is obtained.

Thus, in accordance with this invention, free-running oscillator 26 always picks up at the same part of the sine wave so that each RF pulse is uniform in frequency and phase. By adjusting the Larmor frequency of the nuclei until the strongest primary echo is obtained, the Larmor frequency acts as a master clock and all that is required of clock 28 is to turn the oscillator on for the proper period of time at the preselected time intervals between pulses, usually one or more milliseconds to obtain a meaningful spin-echo reading of the desired property of the specimen being examined.

This results in a substantial simplification of the circuitry and controls required for an NMR spectrometer. The primary improvement is the elimination of the master clock that had to be so accurate that it could adjust the phase of a 10 MHz signal by 90°.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

I claim:

1. A method of tuning an NMR machine to bring the Larmor frequency of the selected nuclei into phase with the alternating magnetic field of the machine comprising the steps of locating a specimen in the static magnetic field, generating alternating magnetic field pulses having the Larmor frequency of the selected nuclei of the specimen, measuring the primary echo train of a selected nuclear magnetic resonance signal, changing the strength of the static electrical field to change the Larmor frequency of the selected nuclei, repeating the measuring and changing steps until the maximum primary echo train is obtained, and holding the stationary magnetic field at that strength to measure the desired nuclear magnetic resonance by the spin-echo method.

2. A method of tuning a NMR spectrometer applying refocusing pulses in a nuclear magnetic resonance spectrometer comprising the steps of locating a specimen in a stationary magnetic field, generating a 90° alternating magnetic field excitation pulse at the Larmor frequency of the selected nuclei of the specimen followed by one or more 180° alternating magnetic field refocusing pulses of preselected duration at fixed time intervals having the same phase relationships using a free-running oscillator that is turned off between pulses, measuring the primary echo train of a selected nuclear magnetic resonance signal, changing the strength of the stationary magnetic field to change the Larmor frequency of the selected nuclei, repeating the pulsing step and the measuring step until the maximum primary echo is obtained, and while holding the stationary field at that strength, measuring the desired nuclear magnetic resonance characteristic using the spin-echo method and the free-running oscillator to supply the pulses.

* * * * *